SEMICONDUCTOR DEVICES

Filed Nov. 15, 1954

INVENTOR.
ERNEST G. LINDER
BY J. L. Whittaker
ATTORNEY

United States Patent Office 2,914,665

Patented Nov. 24, 1959

2,914,665

SEMICONDUCTOR DEVICES

Ernest G. Linder, Princeton, N.J., assignor to Radio Corporation of America, a corporation of Delaware Application November 15, 1954, Serial No. 468,767

8 Claims. (Cl. 250—17)

This invention relates to semiconductor devices and particularly to improved semiconductor devices suitable for high frequency operation as oscillators, detectors, modulators and the like.

In typical semiconductor device operation, the charge carriers which flow through the semiconductor body proceed by a process of diffusion. By this process, the movement of the carriers is determined among other things by their innate mobilities and by their concentration gradient. The diffusion process is inherently a relatively slow process and limits the high frequency operation of semiconductor devices.

Under certain circumstances electric and magnetic fields may be employed to improve high frequency performance. However, this method of operation requires either additional electrodes on the semiconductor device or auxiliary apparatus external to the device itself.

Accordingly, an important object of this invention is to provide a semiconductor device of new and improved form providing improved high frequency operation and overcoming the limitations of the charge carrier diffusion process.

Another object of the invention is to provide an improved semiconductor device suitable for high frequency oscillator operation.

In general, the principles and objects of this invention are accomplished in a semiconductor device which utilizes, in its operation, the motion of electric charge carriers unimpeded by collisions and determined by carrier inertia. Such a device has an arrangement of parts such that an internal electrostatic potential valley exists in the body. With such a gradient, charge carriers of the appropriate sign, i.e. either positive or negative, oscillate in the potential valley between points of the same potential.

According to one aspect of the invention, such a device comprises a body of semiconductor material having two zones of semiconductor material of the same conductivity type separated by a zone of semiconductor material of different conductivity type with each zone being separated from an adjacent zone by a rectifying barrier. This construction provides an internal electrostatic potential distribution within the body from zone to zone. Charge carriers generated in the body, for example within the middle zone or within the outer zones, oscillate between points having the same potential on the electrostatic potential distribution curve. Such charge carriers may be generated thermally or by irradiation of the device by light or X-rays, by charge carrier injection, or the like. According to the invention, the thickness of the middle zone and the adjacent barriers is less than the mean free path of the oscillating charge carriers. The mean free path of the charge carriers is the path traversed thereby before a collision occurs with other charge carriers, impurity centers or atoms or the like. A body having only two zones of different conductivity types separated by a rectifying barrier may also be employed with the barrier thickness being, preferably, less than the mean free path of charge carriers.

According to another aspect of the invention, the outer zones or regions are replaced by surface barrier plates or films in rectifying contact with the surfaces of the middle region.

According to the various aspects of the invention, appropriate circuit arrangements are provided to achieve oscillator, modulator and detector operation.

Thus, the invention provides semiconductor devices which overcome the limitations of the charge carrier diffusion process and provide improved high frequency operation.

The invention is described in greater detail by reference to the drawing wherein.

Similar elements are designated by similar reference characters throughout the drawing.

Figures 1, 2, 3, 4, 5, 6:
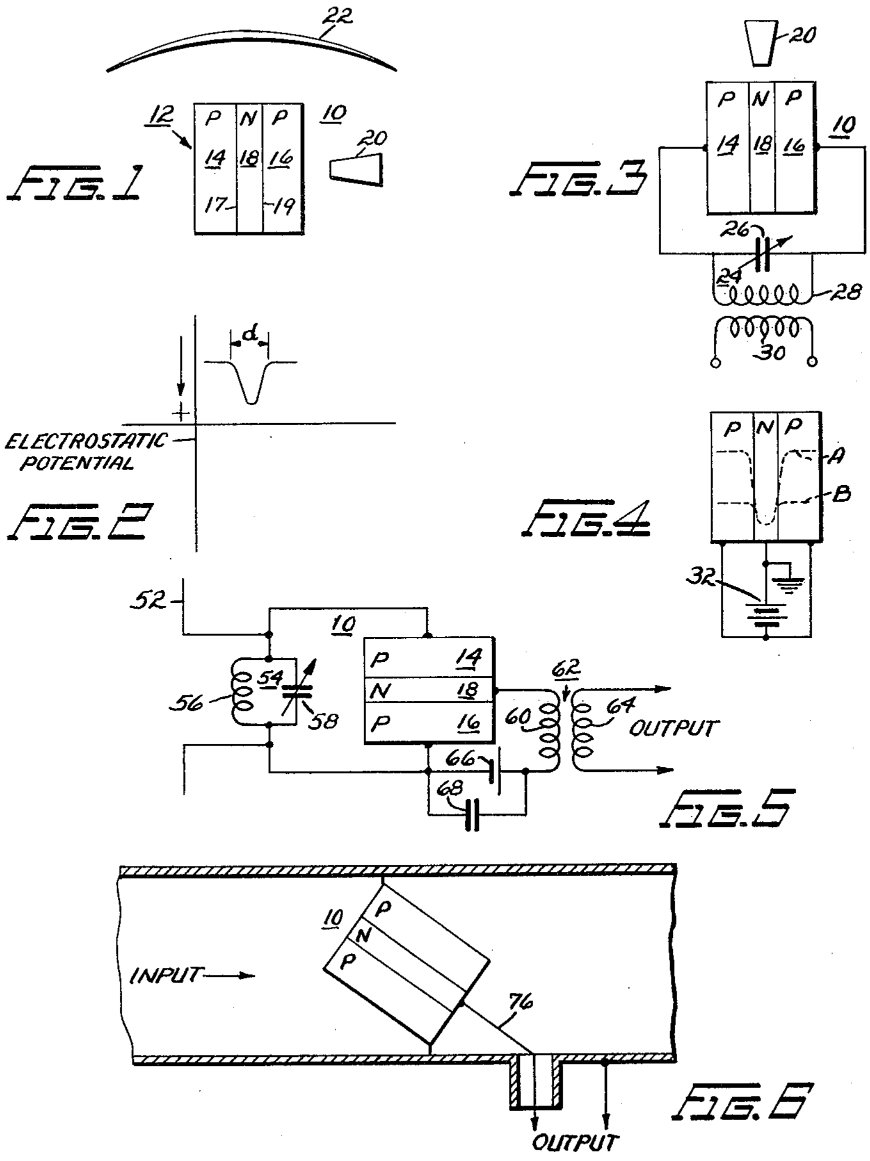
Fig. 1 is a sectional plan view of a device embodying the principles of the invention and a schematic representation of apparatus including an energizing source with which said device is employed.
Fig. 2 is a curve representative of the internal electrostatic potential of the device of Fig. 1.
Fig. 3 shows the device and source of Fig. 1 and a schematic representation of a circuit in which the device may be operated.
Fig. 4 shows the device of Fig. 1 and an electrical bias arrangement therefor.
Fig. 5 is a plan view of the device of Fig. 1 and a schematic representation of still another circuit in which it may be operated; and, Fig. 6 is a plan view of a modification of the device shown in Fig. 5 and a system, partly in section, in which it may be operated.

Referring to Figure 1, a device 10 embodying the principles of the invention comprises a body of semiconductor material 12 including two zones 14 and 16 of the same conductivity-type separated by rectifying barriers 17 and 19 from an intermediate zone 18 of a different conductivity-type. For example, the zones 14, 18, 16, respectively, may be arranged in P–N–P, N–P–N, P–P+–P or N–N+–N order. The notations N+ and P+ designate more highly N-type and P-type materials, respectively, than the notations N and P. Thus, the two outer zones 14, 16 are of the same type and magnitude of conductivity and the middle zone 18 is of the opposite conductivity type or of a different magnitude of conductivity than the two outer zones. The body 12 is assumed to be of P–N–P configuration for purposes of description and may comprise any of the well known semiconductor materials, for example, germanium or silicon or the like. However, for the purposes of the present invention, the optimum materials are those having high charge carrier mobility. Indium antimonide is an example of such a semiconductor material.

With respect to the physical dimensions of the body 12, according to the invention, the total thickness of the middle region or zone 18 and the rectifying barriers 17 and 19 is less than the mean free path of charge carriers within the body. The mean free path of a charge carrier is the distance which the carrier travels before it experiences a collision with other charge carriers or atoms or the like. The mean free path may be controlled by adjusting the density of the charge carriers which impart the characteristic N-type conductivity to the region 18. The density of the charge carriers may be controlled by intentionally controlling or adding the required amount of so-called impurity materials to the region 18 according to the teaching in "Crystal Rectifiers," by Torrey and Whitmer, published in 1948 by McGraw-Hill Book Company, Inc. The introduction of impurities, also called alloying, is described in U.S. Patent No. 2,504,627 to S. Benzer.

The internal electrostatic potential distribution which is characteristic for a body 12 of P–N–P configuration is represented by the curve of Figure 2. The curve shows that the N-type region is more positive than the P-type regions. According to one evolved theory of the invention, if a charge carrier, for example an electron, is created for example at point X on the curve within the P-type region it will be acted upon by the electric field within the crystal in such a way as to oscillate between equipotential points X and Y on the potential curve in the P-type regions 14 and 16. The points X and Y which correspond to the energy of the carrier upon entry into the potential valley may both be in the N-type region 18. Such electrons may be obtained by spontaneous thermal generation within the body if properly active material is employed. Otherwise the desired activation may be achieved by charge carrier injection, or by means of heat, light, X-rays or the like from a source 20. The position of the X and Y on the potential curve is determined by the energy level of the oscillating charge carriers, with charge carriers having the most energy oscillating between points highest on the curve and having the widest amplitude of oscillation. Thus, the points X and Y may also be within the N-type region 18. In the optimum construction, the distance $d$ (Figure 2), between the points X and Y is less than the length of the mean free path of charge carriers within the body.

The device 10 will operate as desired with a semiconductor body including two zones of different conductivity type material separated by a rectifying barrier which has, preferably, a thickness smaller than the mean free path of charge carriers in the body.

The device of Figure 1 may be employed as an oscillator, for example, for generating and directly radiating radio frequency energy. In such an application of the invention referring to Figure 1 a radiation reflector 22 may be employed for directing the radiation generated by the oscillator. The reflector may be parabolic, spherical, or in any other suitable form and the oscillator device is preferably positioned at the focus of the reflector. In an actual construction, the reflector is considerably larger than the oscillator device.

The theory of operation of the present invention is as follows. The width of the potential valley is defined as:

$$d\sqrt{\frac{\epsilon V}{2\pi ne}} \quad (1)$$

where $\epsilon$=the dielectric constant of the semiconductor material
$V$=the depth of the potential valley
$n$=the charge carrier density
$e$=the electronic charge Assuming a constant field in the barrier region between the P and N zones, which is a sufficiently accurate approximation, the electron transit time, $t$, across the distance $d$ is:

$$t=\sqrt{\frac{2m^*}{e}}\cdot\frac{d}{\sqrt{V}} \quad (2)$$

where $m^*$=the effective mass of the charge carrier. Thus the period of oscillation T for the device 10 is:

$$T=4t=\sqrt{\frac{2m^*}{e}}\cdot\frac{4d}{\sqrt{V}}$$

Substituting (1), the expression for $d$, in (2), the expression for T, yields, $$f=\frac{1}{T}=\sqrt{\frac{\pi ne^2}{16m^*\epsilon}} \quad (3)$$

Equation 3 may be rewritten as $$f=\sqrt{\frac{\pi^2 m}{16m^*\epsilon}}\cdot\sqrt{\frac{ne^2}{\pi m}} \quad (4)$$

where $m$=the actual mass of the charge carrier. Finally, introducing numerical values, gives $$f=\sqrt{\frac{\pi^2 m}{16m^*\epsilon}}\cdot 8980\sqrt{n} \quad (5)$$

Expression 5 is similar to the well-known expression for plasma oscillation.

Thus, it is seen that $f$, the frequency of oscillation, may be varied by varying $n$ which may be controlled by the proper introduction of impurity materials into the semiconductor material. The foregoing analysis is substantially exact for the situation wherein the potential distribution is parabolic in the region of the valley minimum. However, if the distribution is not parabolic in form, then side effects enter and the frequency of oscillation may be varied by other parameters, for example, by the bias voltage applied to the device.

Substituting typical values for silicon, for example, $n=10^{18}$, $\epsilon=13$, and assuming $$\frac{m}{m^*}=1$$

then $f=2\cdot 10^{12}$ cycles per second or the wavelength $\lambda=0.15$ mm.

If, for example, $n$, the charge carrier density is of the order of $10^{16}$, then the frequency of oscillation, $f$, $=2\cdot 10^{11}$ cycles per second and the wavelength $\lambda=1.5$ mm.

As described above, in order to achieve efficient oscillation without excessive damping, the mean free path of the oscillating charge carriers should be of the same magnitude or greater than the barrier width. The mean free path, L, is given by the expression $$L=\frac{3\mu}{4e}\sqrt{2\pi mkT}$$

where:

$T$=absolute temperature
$k$=Boltzmann's constant
$\mu$=carrier mobility

The expression for L holds true except at low temperatures where lattice scattering predominates. For silicon doped, for example, with $10^{18}$ phosphorus atoms per cubic centimeter L is approximately $2\cdot 10^{-6}$ cm. Also for this case $d$ is approximately $3\cdot 10^{-6}$ cm. Here, L and $d$ are of the same magnitude.

Referring to Figure 3 in another embodiment of the invention, the device 10 may be employed to generate oscillations in a conventional oscillatory circuit. In one such circuit, a resonant, tunable tank circuit 24 comprising a variable capacitance element 26 in parallel with an inductance element 28 is connected between the two external zones 14 and 16 of the body. Energy generated in the tank circuit is coupled through a suitable coupling coil element 30 to a suitable utilization circuit (not shown). In such operation, the resonant circuit is tuned to the frequency of oscillation generated within the device. The resonant circuit 24 may also be connected between the middle zone 18 and one of the outer P-type zones 14 or 16.

The amplitude of the oscillatory path within the device 10 may be increased by properly applied bias voltages which provide control of the electrostatic potential curve A and varies the depth of the valley as shown in Figure 4. To achieve such a bias the positive terminal of a battery 32 is connected to the middle region 18 and the negative terminal is connected to each of the outer regions 14 and 16. By comparison, the curve B shows the electrostatic potential in the device 10 without voltage bias. By such an arrangement, the voltage across the barriers between the zones 14, 18 and 16 may be increased by a factor of 10 or more as may the amplitude of oscillation. By reversing the polarity of the bias battery 32, the potential valley of the electrostatic potential curve may be made more shallow than that of curve B.

If desired, the two outer regions of the same type of conductivity of the device 10 may be replaced by surface barrier electrodes in the form of metal plates or metal films which are in rectifying contact with opposite surfaces of the region 18.

The above-described devices embodying the principles of the invention may be employed in suitable circuits for operation as detectors. For use as a detector, referring to Figure 5, a device, for example the device 10, is connected in a circuit which includes an antenna 52 which is connected across a parallel tuned circuit 54 including an inductance element 56 and a capacitance element 58 either of which may be variable for tuning the circuit 54. The circuit 54 is also connected across the device 10 between the zones 14 and 16. The region 18 is connected to one end of the primary winding 60 of an output transformer 62, the secondary winding 64 of which is connected to a suitable output circuit. The other end of the primary winding 60 is connected to the positive terminal of a bias battery 66, the negative terminal of which is connected to the region 16. A suitable by-pass condenser 68 is connected across the battery 66. The frequency of oscillation of the device 10 may be varied by varying the voltage of the battery 66 with the tuning of the circuit 54 being also suitably varied.

In operation of the device and circuit of Figure 5, the circuit 54 is tuned to select from the antenna a signal of the same frequency as the frequency of oscillation of the device 10. Such a signal applied between the regions 14 and 16 increases the amplitude of the electron oscillation in the device and increases the energy of the oscillating electrons. As the energy of the electrons is increased above a maximum represented by the uppermost portion of the electrostatic potential curve, some of these electrons circulate into the output circuit and constitute an output signal current. If the input signal at the tuned circuit 54 is modulated, the output signal current varies in accordance with the modulation of the input signal and, accordingly, detector operation is achieved.

Referring to Figure 6 in another detector modification of the invention, the device 10 is mounted within a waveguide 74 in which electromagnetic radio energy is propagated in the direction shown by the arrow. The device 10 is positioned at an angle to the axis of the waveguide in order to provide a favorable impedance match. For high-mode operation, the waveguide may be of substantially any convenient size. The outer regions 14 and 16 are in ohmic contact with walls of the waveguide 74 and the middle region 18 is connected to an output lead 76 which is passed insulatingly through the wall of the waveguide. The radio frequency energy passing along the waveguide is detected in a manner similar to that described above with respect to Figure 5. Other uses of the invention in waveguides will be apparent to those skilled in the art.

What is claimed is:

1. Apparatus comprising: a solid body for responding to applied input energy by increasing the energies of mobile electrical charge-carriers within the body and for producing systematic oscillatory motion of the individual charge-carriers in a predetermined region within said body; and means for controlling a transfer of electrical effects of said motion toward a utilization device from said body; said body constituting a semiconductor device including two zones of semiconductor material separated by said region, and said region including at least one rectifying barrier adjacent one of said zones and being of a thickness smaller than the mean free path of said charge carriers therewithin.

2. Apparatus as in claim 1 in which said electrical effects include radio frequency radiations emanating directly from said body and said means comprises a reflector for receiving a portion of said radiations and reradiating them in a desired direction.

3. Apparatus as in claim 1 in which said two zones are of similar conductivity type and said region which separates them includes a third zone of a markedly different conductivity type and two rectifying barriers at the respective junctions of the third zone with said two zones of similar type.

4. Apparatus as in claim 3 further comprising an external biasing means including a source of direct potential, connections from one pole of the source to both of said two zones of similar type, and a connection from the other pole of the source to said third zone.

5. Apparatus as in claim 3 further comprising a tunable resonant circuit coupled between two of said zones of similar type.

6. Apparatus as in claim 3 further comprising a tunable resonant circuit connected between said two zones; and an output circuit including a bias battery and coupled between one of said two zones of similar type and said third zone.

7. Apparatus as in claim 3 further comprising a hollow waveguide having an input and an output circuit, said two of said zones of similar type being in contact with respective points or the inside of said waveguide and said third zone being connected to said output circuit thereof.

8. In an apparatus for producing systematic oscillatory motion of individual mobile electrical charge carriers in a solid body, a semiconductor body including two zones of semiconductor material of a similar type separated by a third zone of a markedly different type and two rectifying barriers at the respective junctions of the third zone with said two zones of similar type, the total width of said third zone and said two barriers being smaller than the mean free path of charge carriers within said body.

References Cited in the file of this patent

UNITED STATES PATENTS

| | | |
|---|---|---|
| 2,420,892 | McClellan | May 20, 1947 |
| 2,552,052 | Matare | May 8, 1951 |
| 2,588,254 | Horovitz et al. | Mar. 4, 1952 |
| 2,641,713 | Shive | June 9, 1953 |
| 2,657,360 | Wallace | Oct. 27, 1953 |
| 2,669,692 | Pearson | Feb. 16, 1954 |
| 2,691,073 | Lowman | Oct. 5, 1954 |
| 2,692,337 | Hanson | Oct. 19, 1954 |
| 2,692,950 | Wallace | Oct. 26, 1954 |
| 2,705,767 | Hall | Apr. 5, 1955 |
| 2,708,720 | Anderson | May 17, 1955 |
| 2,776,367 | Lehovec | Jan. 1, 1957 |

OTHER REFERENCES

Hollmann, "Self-Oscillating UHF Transistors," Tele-Tech & Electronic Industries, April 1954, pp. 75–77.

UNITED STATES PATENT OFFICE
CERTIFICATE OF CORRECTION

Patent No. 2,914,665 November 24, 1959

Ernest G. Linder

It is hereby certified that error appears in the printed specification of the above numbered patent requiring correction and that the said Letters Patent should read as corrected below.

Column 3, line 45, the left-hand portion of the equation (1), for the italicized "d" read an italicized -- d= --; column 4, line 45, for "Here" read -- Hence --.

Signed and sealed this 17th day of May 1960.

(SEAL)

Attest:

KARL H. AXLINE
Attesting Officer

ROBERT C. WATSON
Commissioner of Patents